United States Patent
Kim et al.

(10) Patent No.: US 12,022,677 B2
(45) Date of Patent: Jun. 25, 2024

(54) ORGANIC LIGHT-EMITTING DISPLAY DEVICE HAVING AN UPPER SUBSTRATE FORMED BY A METAL AND METHOD OF FABRICATING THE SAME

(71) Applicant: LG Display Co., Ltd., Seoul (KR)

(72) Inventors: Dong-Jin Kim, Seoul (KR); Jae-Woon Baek, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 211 days.

(21) Appl. No.: 17/116,687

(22) Filed: Dec. 9, 2020

(65) Prior Publication Data

US 2021/0091335 A1    Mar. 25, 2021

Related U.S. Application Data

(63) Continuation of application No. 15/985,919, filed on May 22, 2018, now Pat. No. 10,892,438.

(30) Foreign Application Priority Data

May 22, 2017 (KR) ........................ 10-2017-0063016

(51) Int. Cl.
*H10K 50/842* (2023.01)
*H10K 50/84* (2023.01)
(Continued)

(52) U.S. Cl.
CPC ....... *H10K 50/8423* (2023.02); *H10K 59/131* (2023.02); *H05K 1/147* (2013.01);
(Continued)

(58) Field of Classification Search
CPC .......... H01L 2227/323; H01L 27/3276; H05K 2201/10681; H05K 2201/10128;
(Continued)

(56) References Cited

U.S. PATENT DOCUMENTS 5,194,027 A * 3/1993 Kruskopf ............... H05B 33/04
445/24
6,966,482 B2 * 11/2005 Totani .................... H05K 3/363
257/734

(Continued)

FOREIGN PATENT DOCUMENTS

CN    103969867 A    8/2014
EP    3 035 406 A1    6/2016
(Continued)

OTHER PUBLICATIONS

Korean Office Action dated Jan. 28, 2021 issued in Patent Application No. 10-2017-0063016 (6 pages).

(Continued)

*Primary Examiner* — Sophia T Nguyen
(74) *Attorney, Agent, or Firm* — POLSINELLI PC (57) ABSTRACT

An organic light-emitting display device is provided. The organic light-emitting display device includes an upper substrate coupling a lower substrate by an encapsulating layer. The upper substrate includes a metal. An inclined surface is formed at an edge of a substrate of the upper substrate by a rotating polishing wheel. Thus, in the organic light-emitting display device, the reliability may be prevented from being decreased by the metal burr without lowering the process efficiency and uniformity.

10 Claims, 5 Drawing Sheets

(51) Int. Cl.
*H10K 59/12* (2023.01)
*H10K 59/131* (2023.01)
*H05K 1/14* (2006.01)

(52) U.S. Cl.
CPC ... *H05K 2201/10128* (2013.01); *H10K 50/84* (2023.02); *H10K 50/846* (2023.02); *H10K 59/1201* (2023.02)

(58) Field of Classification Search
CPC ........ H05K 1/148; H05K 1/147; H10K 50/84; H10K 50/844; H10K 50/8423; H10K 59/1201; H10K 59/12
See application file for complete search history.

(56) References Cited

U.S. PATENT DOCUMENTS

| | | | | |
|---|---|---|---|---|
| 7,122,745 | B2* | 10/2006 | Nakakuki | H05K 3/363 174/261 |
| 8,456,851 | B2* | 6/2013 | Grunthaner | G06F 3/0416 361/810 |
| 8,829,790 | B2 | 9/2014 | Yee | |
| 8,858,286 | B2 | 10/2014 | Lee et al. | |
| 9,028,296 | B2* | 5/2015 | Venkatachalam | B24B 9/10 451/44 |
| 9,082,774 | B1 | 7/2015 | Shin et al. | |
| 9,142,796 | B2* | 9/2015 | Shin | H01L 27/3276 |
| 9,520,088 | B2* | 12/2016 | Lim | G09G 3/3291 |
| 9,608,230 | B2* | 3/2017 | Fujino | H10K 59/805 |
| 9,684,209 | B2* | 6/2017 | Yu | G02F 1/133305 |
| 9,775,255 | B1* | 9/2017 | Wang | H05K 3/0044 |
| 9,788,429 | B2* | 10/2017 | Hong | H05K 1/147 |
| 9,805,643 | B2 | 10/2017 | Wright et al. | |
| 10,162,384 | B2* | 12/2018 | Lee | G06F 1/163 |
| 10,359,660 | B2* | 7/2019 | Sato | G02F 1/133512 |
| RE47,781 | E* | 12/2019 | Kang | H10K 50/8426 |
| 10,547,024 | B2* | 1/2020 | Hwang | H01L 51/5246 |
| 10,642,080 | B2 | 5/2020 | Park et al. | |
| 10,892,438 | B2* | 1/2021 | Kim | H01L 27/3276 |
| 10,903,447 | B2* | 1/2021 | Hwang | H01L 51/5246 |
| 11,006,525 | B2* | 5/2021 | Song | H05K 3/361 |
| 2002/0005838 | A1 | 1/2002 | Inoue et al. | |
| 2002/0012780 | A1* | 1/2002 | Yuyama | H05K 1/028 428/416 |
| 2002/0014518 | A1* | 2/2002 | Totani | H05K 3/363 228/180.1 |
| 2002/0149320 | A1 | 10/2002 | Maruyama et al. | |
| 2002/0189862 | A1* | 12/2002 | Miyake | H05K 3/363 174/262 |
| 2002/0192471 | A1* | 12/2002 | Homme | G01T 1/20 428/408 |
| 2003/0222061 | A1 | 12/2003 | Langer et al. | |
| 2004/0197067 | A1* | 10/2004 | Kumagai | G02B 6/3652 385/137 |
| 2004/0238827 | A1 | 12/2004 | Takayama et al. | |
| 2006/0157271 | A1* | 7/2006 | Miura | H05K 1/118 174/250 |
| 2006/0287467 | A1* | 12/2006 | Hwang | H05K 1/0346 528/170 |
| 2006/0287468 | A1* | 12/2006 | Hwang | C08G 73/16 528/170 |
| 2007/0222384 | A1* | 9/2007 | Yonemoto | H01L 51/524 313/506 |
| 2007/0278952 | A1 | 12/2007 | Sung et al. | |
| 2008/0074853 | A1* | 3/2008 | Jang | H05K 1/189 361/749 |
| 2009/0051272 | A1 | 2/2009 | Fukuda et al. | |
| 2009/0151988 | A1* | 6/2009 | Lee | H05K 1/028 29/829 |
| 2009/0168318 | A1 | 7/2009 | Moon et al. | |
| 2009/0176080 | A1* | 7/2009 | Lai | B32B 27/08 428/335 |
| 2010/0142178 | A1 | 6/2010 | Yee et al. | |
| 2010/0243156 | A1* | 9/2010 | Yonemoto | H01L 51/524 156/305 |
| 2010/0321758 | A1 | 12/2010 | Bugno et al. | |
| 2011/0057208 | A1* | 3/2011 | Jeon | H10K 50/8426 257/E33.001 |
| 2011/0101853 | A1 | 5/2011 | Lee et al. | |
| 2011/0157114 | A1 | 6/2011 | Ko et al. | |
| 2011/0193478 | A1 | 8/2011 | Kim | |
| 2011/0194063 | A1* | 8/2011 | Lee | H05B 33/10 313/504 |
| 2011/0223839 | A1 | 9/2011 | Jung et al. | |
| 2011/0315977 | A1 | 12/2011 | Murayama et al. | |
| 2012/0062481 | A1 | 3/2012 | Kim et al. | |
| 2012/0092838 | A1* | 4/2012 | Kitano | H05K 1/0215 174/254 |
| 2012/0118616 | A1* | 5/2012 | Saito | H05K 3/287 174/254 |
| 2012/0162938 | A1* | 6/2012 | Kim | G02F 1/1341 361/750 |
| 2012/0205698 | A1 | 8/2012 | Yamazaki et al. | |
| 2013/0135829 | A1* | 5/2013 | Lee | G02F 1/133528 361/748 |
| 2013/0161078 | A1* | 6/2013 | Li | H05K 1/147 29/874 |
| 2013/0257696 | A1* | 10/2013 | Ha | H01L 27/3276 345/76 |
| 2013/0271710 | A1* | 10/2013 | Tatemura | G02F 1/1368 349/110 |
| 2014/0048778 | A1* | 2/2014 | Park | H01M 14/005 257/40 |
| 2014/0085281 | A1* | 3/2014 | Lim | G09G 3/3266 345/206 |
| 2014/0098055 | A1* | 4/2014 | Choi | G06F 3/044 345/173 |
| 2014/0103315 | A1* | 4/2014 | Jung | H01L 25/50 257/40 |
| 2014/0111116 | A1 | 4/2014 | Shin et al. | |
| 2014/0183491 | A1* | 7/2014 | Shin | H01L 51/524 257/40 |
| 2014/0204293 | A1* | 7/2014 | Kim | G02F 1/133308 349/96 |
| 2014/0209890 | A1* | 7/2014 | Sato | H01L 51/5212 438/46 |
| 2014/0239317 | A1* | 8/2014 | Bang | H05K 3/361 438/28 |
| 2014/0285953 | A1* | 9/2014 | Hirai | G06F 1/1637 361/679.01 |
| 2014/0374719 | A1* | 12/2014 | Cho | H01L 51/524 257/40 |
| 2015/0002936 | A1 | 1/2015 | Jun et al. | |
| 2015/0102332 | A1 | 4/2015 | Shin et al. | |
| 2015/0108441 | A1* | 4/2015 | Eom | H10K 59/124 257/40 |
| 2015/0162388 | A1* | 6/2015 | Kim | G06F 1/1637 257/40 |
| 2015/0162568 | A1 | 6/2015 | Bai et al. | |
| 2015/0211707 | A1* | 7/2015 | Watanabe | G09G 5/373 362/330 |
| 2015/0230331 | A1* | 8/2015 | Lee | H05K 1/0259 361/220 |
| 2015/0264798 | A1* | 9/2015 | Stanley | H05K 3/284 361/749 |
| 2016/0037607 | A1 | 2/2016 | Kim et al. | |
| 2016/0043344 | A1* | 2/2016 | Shin | H01L 25/167 438/23 |
| 2016/0087237 | A1 | 3/2016 | Oh et al. | |
| 2016/0088726 | A1* | 3/2016 | Jeon | H05K 1/147 361/749 |
| 2016/0118454 | A1 | 4/2016 | Park et al. | |
| 2016/0128194 | A1* | 5/2016 | Hong | H05K 1/147 361/749 |
| 2016/0155986 | A1 | 6/2016 | Ito | |
| 2016/0164024 | A1 | 6/2016 | Takamuki | |
| 2016/0174332 | A1* | 6/2016 | Shin | H01L 51/5243 313/504 |
| 2016/0204133 | A1 | 7/2016 | Kim et al. | |
| 2016/0210893 | A1* | 7/2016 | Lee | G06F 1/1643 |

(56) References Cited

U.S. PATENT DOCUMENTS

| | | | |
|---|---|---|---|
| 2016/0218315 A1* | 7/2016 | Fujino | H10K 71/60 |
| 2016/0369053 A1 | 12/2016 | Chiang et al. | |
| 2016/0380226 A1 | 12/2016 | Hayashi et al. | |
| 2017/0012243 A1* | 1/2017 | Suzuki | H10K 59/873 |
| 2017/0012378 A1* | 1/2017 | Hassan-Ali | H05K 3/361 |
| 2017/0155080 A1* | 6/2017 | Jo | H10K 50/844 |
| 2017/0155086 A1 | 6/2017 | Kang | |
| 2017/0170425 A1 | 6/2017 | Kim et al. | |
| 2017/0176808 A1* | 6/2017 | Sano | G02F 1/134309 |
| 2017/0256737 A1 | 9/2017 | Morishima et al. | |
| 2017/0257955 A1* | 9/2017 | Wang | H05K 3/0044 |
| 2017/0269399 A1* | 9/2017 | Park | H01L 51/0096 |
| 2017/0331072 A1* | 11/2017 | Jo | H10K 77/111 |
| 2017/0338297 A1* | 11/2017 | Li | H01L 27/3283 |
| 2017/0343852 A1* | 11/2017 | Park | H01L 51/5284 |
| 2017/0371194 A1* | 12/2017 | Tomioka | H01L 27/124 |
| 2018/0062111 A1* | 3/2018 | Kim | H10K 50/844 |
| 2018/0063962 A1* | 3/2018 | Lee | H05K 1/118 |
| 2018/0114822 A1 | 4/2018 | Kim et al. | |
| 2018/0150111 A1 | 5/2018 | Kim et al. | |
| 2018/0172933 A1* | 6/2018 | Noguchi | H05K 1/147 |
| 2018/0188579 A1* | 7/2018 | Jeong | G02F 1/13336 |
| 2018/0336817 A1* | 11/2018 | Kim | H01L 27/3276 |
| 2019/0006335 A1* | 1/2019 | Lee | H05K 3/403 |
| 2019/0067630 A1* | 2/2019 | Hwang | H01L 51/5246 |
| 2019/0069413 A1* | 2/2019 | Kasugai | H04N 5/2256 |
| 2019/0077120 A1 | 3/2019 | Kim et al. | |
| 2019/0164932 A1 | 5/2019 | Lee et al. | |
| 2019/0165297 A1* | 5/2019 | Lee | G09G 3/3225 |
| 2019/0165309 A1 | 5/2019 | Kim et al. | |
| 2019/0181387 A1 | 6/2019 | Go et al. | |
| 2019/0245158 A1* | 8/2019 | Song | H01L 51/5246 |
| 2021/0091335 A1* | 3/2021 | Kim | H01L 27/3276 |
| 2021/0119173 A1* | 4/2021 | Kim | H01L 51/5243 |

FOREIGN PATENT DOCUMENTS

| | | |
|---|---|---|
| JP | 2011-048329 A | 3/2011 |
| JP | 2012-088417 A | 5/2012 |
| KR | 10-2008-0057038 A | 6/2008 |
| KR | 10-2014-0095621 A | 8/2014 |
| KR | 10-2016-0073252 A | 6/2016 |
| TW | 201227951 A | 7/2012 |

OTHER PUBLICATIONS

Office Action dated Mar. 18, 2019 with English translation issued in the corresponding Taiwanese Patent Application No. 107116830, pp. 1-13.

Chinese Office Action dated Jul. 26, 2022 issued in counterpart Patent Application No. 201810489366.8 w/English Translation (11 pages).

* cited by examiner

ORGANIC LIGHT-EMITTING DISPLAY DEVICE HAVING AN UPPER SUBSTRATE FORMED BY A METAL AND METHOD OF FABRICATING THE SAME

CROSS-REFERENCE TO RELATED APPLICATION

This application is a continuation of U.S. application Ser. No. 15/985,919, filed May 22, 2018, which claims the priority benefit of Korean Patent Application No. 10-2017-0063016, filed on May 22, 2017, of which the full disclosures of these applications are incorporated herein by reference for all purposes.

BACKGROUND

Field of the Disclosure

The present disclosure relates to an organic light-emitting display device comprising an upper substrate including a metal, and a lower substrate coupled to the upper substrate by an encapsulating layer covering a light-emitting structure, and a method of fabricating the same.

Description of the Background

Generally, an electronic appliance, such as a monitor, a TV, a laptop computer, and a digital camera, includes a display device to realize an image. For example, the display device may include a liquid crystal display device and/or an organic light-emitting display device.

The organic light-emitting display device may include a display panel, a gate driver applying a gate signal to the display panel, and a data driver applying a data signal to the display panel. The display panel may include a lower substrate and an upper substrate attached to the lower substrate. A light-emitting structure may be disposed between the lower substrate and the upper substrate. For example, the display panel may further include an encapsulating layer covering the light-emitting structure. A space between the lower substrate and the upper substrate may be filled by the encapsulating layer.

The gate driver and/or the data driver may be electrically connected to the display panel by a flexible printed circuit board (FPCB). For example, the gate driver and/or the data driver may include a drive IC mounted on the FPCB. The FPCB may be electrically connected to the light-emitting structure by a pad on the lower substrate. The FPCB may extend onto an upper surface of the upper substrate opposite to the lower substrate.

The organic light-emitting display device may include the upper substrate formed of metal. For example, a method of fabricating the organic light-emitting display device may include forming the upper substrate by a laser cutting process. When the upper substrate is formed by the laser cutting process, a metal burr may be formed at an edge of a surface of the upper substrate. Thus, in the organic light-emitting display device, a moisture-permeating path may be provided due to an insulating layer damaged by the metal burr, or a signal applied to the display panel may be distorted or interrupted due to the FPCB damaged by the metal burr.

In order to solve the problem caused by the metal burr, the method of fabricating the organic light-emitting display device may include polishing the surface of the upper substrate formed by the laser cutting process using a polishing unit. However, since the metal burr cannot be completely removed only by a surface polishing process, the method of fabricating the organic light-emitting display device further requires inspecting the surface of the upper substrate, and additional polishing the surface of the upper substrate individually. Thus, in the organic light-emitting display device, the process efficiency can be decreased and the uniformity can be lowered due to change the shape of the surface of the upper substrate depending on whether the substrate is further polished or not.

SUMMARY

Accordingly, the present disclosure is directed to a display device that substantially obviates one or more problems due to limitations and disadvantages of the related art.

More specifically, the present disclosure is to provide an organic light-emitting display device in which the reliability can be prevented from being decreased by the metal burr without lowering the process efficiency and uniformity.

In addition, the present disclosure is to provide a display device in which the metal burr may be completely removed by a single process.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light-emitting display device including an upper substrate on a lower substrate. The upper substrate includes a metal. An encapsulating layer is disposed between the lower substrate and the upper substrate. The upper substrate includes a side inclined surface. The side inclined surface of the upper substrate is located between an upper surface of the upper substrate opposite to the encapsulating layer and a side surface of the upper substrate. The side inclined surface is a concavo-convex shape.

The side inclined surface of the upper substrate may overlap the lower substrate in the outside of the encapsulating layer.

The concavo-convex shape of the side inclined surface may extend in a direction.

The concavo-convex shape of the side inclined surface may extend along the side surface of the upper substrate.

A pad may be disposed on the lower substrate exposed by the encapsulating layer. The pad may be connected to a flexible printed circuit board (FPCB). The FPCB may extend onto the upper surface of the upper substrate. The FPCB may include a first FPCB insulating layer, a FPCB conductive layer and a second FPCB insulating layer, which are sequentially stacked. The first FPCB insulating layer may be located close to the upper substrate. A thickness of the first FPCB insulating layer may be larger than a height of the concavo-convex shape of the side inclined surface.

The thickness of the first FPCB insulating layer may be a value between a thickness of the FPCB conductive layer and a thickness of the second FPCB insulating layer.

A corner inclined surface may be disposed at a corner of the upper surface of the upper substrate. A length of the corner inclined surface may be longer than a length of the side inclined surface.

The corner inclined surface of the upper substrate may overlap with the lower substrate in the outside of the encapsulating layer.

A vertical distance between a lower surface of the upper substrate and the corner inclined surface may be equal to a vertical distance between the lower surface of the upper substrate and the side inclined surface.

A height of the corner inclined surface may be equal to a height of the side inclined surface.

A method of fabricating the organic light-emitting display device includes forming an upper mother substrate using a metal, forming an upper substrate by cutting the upper mother substrate using a laser, forming an inclined surface at an edge of a surface of the upper substrate by a rotating polishing wheel, and coupling the upper substrate in which the inclined surface is formed to a lower substrate in which a light-emitting structure is formed. Forming the upper substrate to the lower substrate includes locating the upper substrate on the lower substrate such that the inclined surface of the upper substrate faces the lower substrate.

An encapsulating layer may be formed on the upper mother substrate. Forming the upper substrate may include cutting the encapsulating layer by the laser. Forming the inclined surface may include polishing the edge of the surface of the upper substrate opposite to the encapsulating layer using the polishing wheel.

Forming the inclined surface may include locating the upper substrate above the polishing wheel, and polishing the edge of the surface of the upper substrate facing the polishing wheel by the polishing wheel.

Forming the inclined surface may include polishing the edge of the upper substrate using a side surface of the polishing wheel.

The upper substrate in which the inclined surface is formed may be cleaned before coupling the upper substrate to the lower substrate. Cleaning the upper substrate may include moving particles which is disposed on the surface of the upper substrate to the outside of the upper substrate by a brush.

The polishing wheel may be formed of diamond.

The inclined surface of the upper substrate may be formed in a concavo-convex shape.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Hereinafter, details related to the above objects, technical configurations, and operational effects of the aspects of the present disclosure will be clearly understood by the following detailed description with reference to the drawings, which illustrate some aspects of the present disclosure. Here, the aspects of the present disclosure are provided in order to allow the technical sprit of the present disclosure to be satisfactorily transferred to those skilled in the art, and thus the present disclosure may be embodied in other forms and is not limited to the aspects described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular aspects, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1:
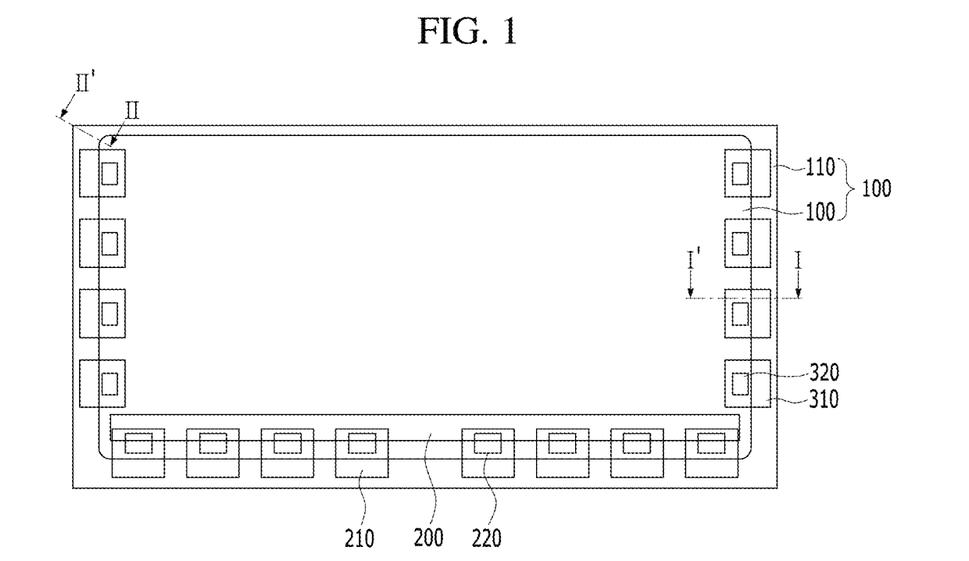
FIG. 1 is a view schematically showing an organic light-emitting display device according to an aspect of the present disclosure.
Figure 2A:
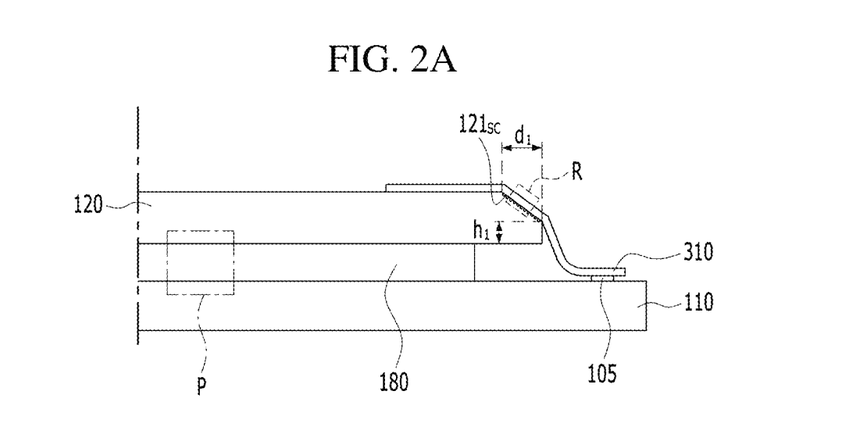
FIG. 2A is a view taken along I-I' of FIG. 1.
Figure 2B:
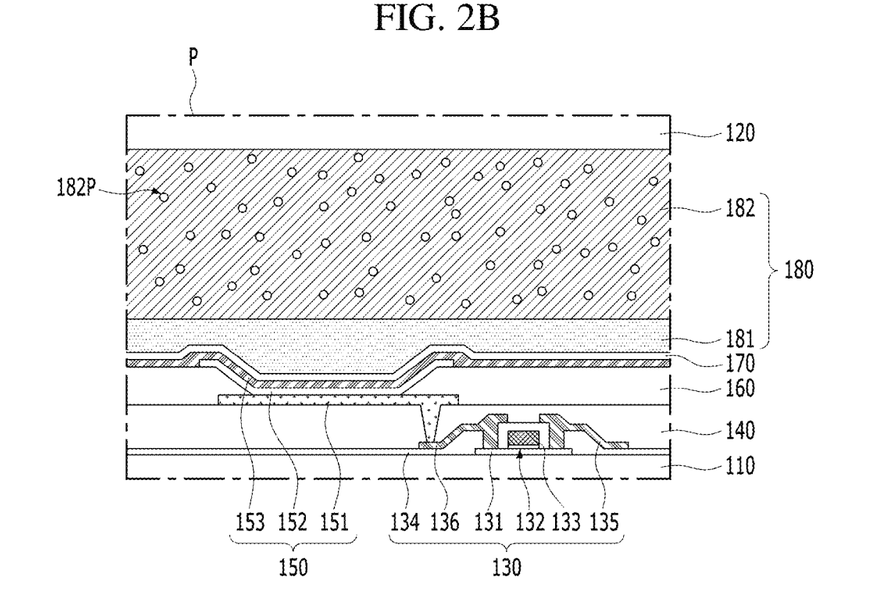
FIG. 2B is an enlarged view of region P in FIG. 2A.
Figure 2C:
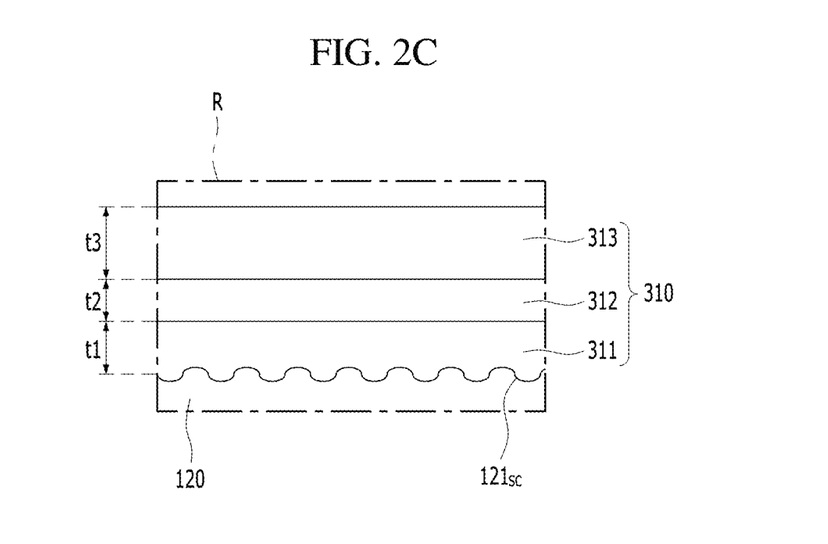
FIG. 2C is an enlarged view of region R in FIG. 2A.
Figure 2D:
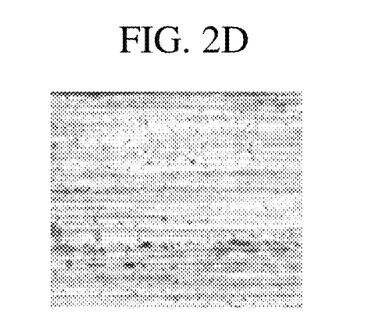
FIG. 2D is a view showing a side inclined surface illustrated in FIG. 2A.
Figure 3:
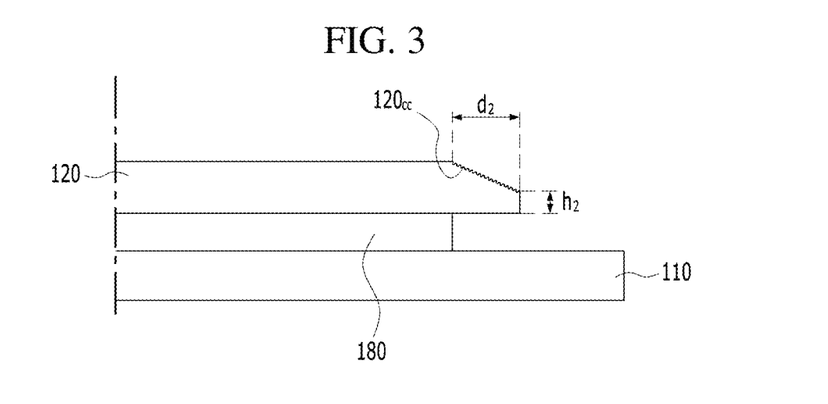
FIG. 3 is a view taken along II-IF of FIG. 1.

FIG. 1 is a view schematically showing an organic light-emitting display device according to an aspect of the present disclosure. FIG. 2A is a view taken along I-I' of FIG. 1. FIG. 2B is an enlarged view of region P in FIG. 2A. FIG. 2C is an enlarged view of region R in FIG. 2A. FIG. 2D is a view showing a side inclined surface illustrated in FIG. 2A. FIG. 3 is a view taken along II-IF of FIG. 1.

Referring to FIGS. 1, 2A to 2D and 3, the organic light-emitting display device according to an aspect of the present disclosure may include a display panel 100. The display panel 100 may include a lower substrate 110 and an upper substrate 120. The lower substrate 110 may include an insulating material. The lower substrate 110 may include a transparent material. For example, the lower substrate 110 may include glass or plastic. The upper substrate 120 may include a material different from the lower substrate 110. For example, the upper substrate 120 may include a material having a predetermined strength. The upper substrate 120 may include a material having a high reflectance. For example, the upper substrate 120 may include a metal such as aluminum (Al) and copper (Cu).

A size of the upper substrate 120 may be smaller than a size of the lower substrate 110. For example, the upper substrate 120 may include a side surface located on an upper surface of the lower substrate 110 facing the upper substrate 120. At least one pad 105 may be located on a region of the upper surface of the lower substrate 110 which does not overlap the upper substrate 120.

The upper substrate 120 may include an inclined surface 120cc (shown in FIG. 3) and 121sc (shown in FIG. 2A) at an edge of an upper surface of the upper substrate 120 which is opposite to the lower substrate 110. For example, the upper substrate 120 may include a side inclined surface 121sc located between the upper surface and a side surface of the upper substrate 120, and a corner inclined surface 120cc located at a corner of the upper surface of the upper substrate 120.

A vertical distance h1 between a lower surface of the upper substrate 120 facing the lower substrate 110 and the side inclined surface 121sc may be equal to a vertical distance h2 between the lower surface of the upper substrate 120 and the corner inclined surface 120cc. For example, the vertical height of the side inclined surface 121sc may be equal to the vertical height of the corner inclined surface 120cc.

A length of the corner inclined surface 120cc may be longer than a length of the side inclined surface 121sc. For example, a horizontal distance d1 of the side inclined surface 121sc may be shorter than a horizontal distance d2 of the corner inclined surface 120cc. The inclination angle of the side inclined surface 121sc with respect to the lower surface of the upper substrate 120 may the inclination angle of the corner inclined surface 120cc with respect to the lower surface of the upper substrate 120.

The side inclined surface 121sc and the corner inclined surface 120cc of the upper substrate 120 may be a concavo-convex shape. For example, the side inclined surface 121sc and the corner inclined surface 120cc may extend along the side surface of the upper substrate 120. The side inclined surface 121sc and the corner inclined surface 120cc may include a concave region and a convex region which are repeated in a direction perpendicular to the side surface of the upper substrate 120.

As shown in FIG. 2B, a thin film transistor 130, a light-emitting structure 150 and an encapsulating layer 180 may be disposed between the lower substrate 110 and the upper substrate 120.

The thin film transistor 130 may be located in close proximity to the lower substrate 110. For example, the thin film transistor 130 may be disposed between the lower substrate 110 and the light-emitting structure 150. The thin film transistor 130 may include a semiconductor pattern 131, a gate insulating layer 132, a gate electrode 133, an interlayer insulating layer 134, a source electrode 135 and a drain electrode 136.

The semiconductor pattern 131 may include a semiconductor material. For example, the semiconductor pattern 131 may include amorphous silicon or poly-crystalline silicon. The semiconductor pattern 131 may include an oxide semiconductor material. For example, the semiconductor pattern 131 may include IGZO.

The semiconductor pattern 131 may include a source region, a drain region and a channel region. The channel region may be disposed between the source region and the drain region. The conductivity of the channel region may be lower than the conductivities of the source region and the drain region. For example, the source region and the drain region may include a conductive impurity.

The gate insulating layer 132 may be located on the semiconductor pattern 131. A size of the gate insulating layer 132 may be smaller than a size of the semiconductor pattern 131. For example, the gate insulating layer 132 may overlap with the channel region of the semiconductor pattern 131.

The gate insulating layer 132 may include an insulating material. For example, the gate insulating layer 132 may include silicon oxide and/or silicon nitride. The gate insulating layer 132 may include a high-K material. For example, the gate insulating layer 132 may include hafnium oxide (HfO) or titanium oxide (TiO). The gate insulating layer 132 may be a multi-layer structure.

The gate electrode 133 may be disposed on the gate insulating layer 132. The gate insulating layer 132 may insulate the gate electrode 133 from the semiconductor pattern 131. The gate electrode 133 may overlap the channel region of the semiconductor pattern 131. For example, a side surface of the gate insulating layer 132 may be vertically aligned with a side surface of the gate electrode 133. The gate insulating layer 132 may have a side surface being continuous with the side surface of the gate electrode 133.

The gate electrode 133 may include a conductive material. For example, the gate electrode 133 may include a metal such as aluminum (Al), chrome (Cr), molybdenum (Mo) and tungsten (W).

The interlayer insulating layer 134 may be located on the semiconductor pattern 131 and the gate electrode 133. The interlayer insulating layer 134 may extend beyond the semiconductor pattern 131. For example, a side surface of the semiconductor pattern 131 may be covered by the interlayer insulating layer 134.

The interlayer insulating layer 134 may include an insulating material. For example, the interlayer insulating layer 134 may include silicon oxide and/or silicon nitride. The interlayer insulating layer 134 may have a multi-layer structure.

The source electrode 135 may be disposed on the interlayer insulating layer 134. For example, the source electrode 135 may overlap with the source region of the semiconductor pattern 131. The source electrode 135 may be electrically connected to the source region of the semiconductor pattern 131. For example, the interlayer insulating layer 134 may include a contact hole exposing the source region of the semiconductor pattern 131.

The source electrode 135 may include a conductive material. For example, the source electrode 135 may include a metal such as aluminum (Al), chrome (Cr), molybdenum (Mo) and tungsten (W). The source electrode 135 may include a material different from the gate electrode 133.

The drain electrode 136 may be disposed on the interlayer insulating layer 134. For example, the drain electrode 136 may overlap the drain region of the semiconductor pattern 131. The drain electrode 136 may be separated from the source electrode 135. The drain electrode 136 may be electrically connected to the drain region of the semiconductor pattern 131. For example, the interlayer insulating layer 134 may include a contact hole exposing the drain region of the semiconductor pattern 131.

The drain electrode 136 may include a conductive material. For example, the drain electrode 136 may include a metal such as aluminum (Al), chrome (Cr), molybdenum (Mo) and tungsten (W). The drain electrode 136 may include a material different from the gate electrode 133. For example, the drain electrode 136 may include a material same as the source electrode 135.

The organic light-emitting display device according to an aspect of the present disclosure is described that the semiconductor pattern 131 may be in direct contact with the lower substrate 110. However, the organic light-emitting display device according to another aspect of the present disclosure may include a buffer layer between the lower substrate 110 and the thin film transistor 130. The buffer layer may include an insulating material. For example, the buffer layer may include silicon oxide or silicon nitride.

The organic light-emitting display device according to an aspect of the present disclosure is described that the semiconductor pattern 131 is located in close proximity to the lower substrate 110. However, in the organic light-emitting display device according to another aspect of the present disclosure, the semiconductor pattern 131 of the thin film transistor 130 may be located between the gate electrode 133 and the source/drain electrodes 135 and 136.

An over-coat layer 140 may be disposed on the thin film transistor 130 and the upper substrate 120. The thin film transistor 130 may be covered by the over-coat layer 140. The over-coat layer 140 may remove a thickness difference due to the thin film transistor 130. For example, an upper surface of the over-coat layer 140 facing the upper substrate 120 may be a flat surface. The upper surface of the over-coat layer 140 may be parallel with the upper surface of the lower substrate 110. The over-coat layer 140 may include an insulating material. For example, the over-coat layer 140 may include an organic material.

The organic light-emitting display device according to an aspect of the present disclosure is described that the over-coat layer 140 is in direct contact with the thin film transistor 130. However, the organic light-emitting display device according to another aspect of the present disclosure may include a lower passivation layer disposed between the thin film transistor 130 and the over-coat layer 140. The lower passivation layer may include a material different from the over-coat layer 140. For example, the lower passivation layer may include an inorganic material.

The light-emitting structure 150 may generate light realizing a specific color. For example, the light-emitting structure 150 may include a lower light-emitting electrode 151, a light-emitting layer 152 and an upper light-emitting electrode 153, which are sequentially stacked. The light-emitting structure 150 may be disposed between the over-coat layer 140 and the upper substrate 120. The light-emitting structure 150 may be controlled by the thin film transistor 130. For example, the lower light-emitting electrode 151 of the light-emitting structure 150 may be electrically connected to the drain electrode 136 of the thin film transistor 130. The over-coat layer 140 may include a contact hole exposing the drain electrode 136 of the thin film transistor 130.

The lower light-emitting electrode 151 may include a conductive material. The lower-light-emitting electrode 151 may include a transparent material. For example, the lower light-emitting layer 151 may include ITO or IZO.

In the organic light-emitting display device according to an aspect of the present disclosure, the lower light-emitting electrode 151 of each light-emitting structure 150 may be separated from the lower light-emitting electrode 151 of adjacent light-emitting structure 150. For example, the organic light-emitting display device according to the aspect of the present disclosure may include a bank insulating layer 160 separating between the lower light-emitting electrodes 151 of the adjacent light-emitting structures 150. The bank insulating layer 160 may cover an edge of each lower light-emitting electrode 151. The bank insulating layer 160 may include an insulating material. For example, the bank insulating layer 160 may include an organic material.

The light-emitting layer 152 may generate light having luminance corresponding to a voltage difference between the lower light-emitting electrode 151 and the upper light-emitting electrode 153. The light generated by the light-emitting layer 152 may realize a specific color. For example, the light-emitting layer 152 may generate the light realizing one of red color, green color, blue color and white color. Each of the light-emitting structures 150 may realize a color different from the adjacent light-emitting structure 150. For example, the light-emitting layer 152 of each light-emitting structure 150 may be spaced away from the light-emitting layer 152 of the adjacent light-emitting structure 150. A side surface of the light-emitting structure 150 may be disposed on the bank insulating layer 160.

The light-emitting layer 152 may include an emitting material layer (EML) having an emission material. The emission material is an organic material. The light-emitting layer 152 may have a multi-layer structure in order to increase luminous efficacy. For example, the light-emitting layer 152 may further include at least one of a hole injection layer (HIL), a hole transport layer (HTL), an election transport layer (ETL) and an electron injection layer (EIL).

The upper light-emitting electrode 153 may include a conductive material. The upper light-emitting electrode 153 may include a material different from the lower light-emitting electrode 151. For example, the upper light-emitting electrode 153 may include a metal such as aluminum (Al). The reflectance of the upper light-emitting electrode 153 may be higher than the reflectance of the lower light-emitting electrode 151.

In the organic light-emitting display device according to an aspect of the present disclosure, the upper light-emitting electrode 153 of each light-emitting structure 150 may be connected to each other. For example, in the organic light-emitting display device according to an aspect of the present disclosure, the upper light-emitting electrode 153 may extend onto the bank insulating layer 160. A side surface of the light-emitting layer 152 of each light-emitting structure 150 may be in direct contact with the upper light-emitting electrode 153.

The organic light-emitting display device according to an aspect of the present disclosure may include an upper passivation layer 170 on the light-emitting structure 150. The upper passivation layer 170 may prevent damage from the light-emitting structure 150 due to moisture or particles. For example, the upper passivation layer 170 may include an inorganic material.

The encapsulating layer 180 may be disposed between the upper passivation layer 170 and the upper substrate 120. The encapsulating layer 180 may include an adhesive material. For example, the upper substrate 120 may be coupled to the lower substrate 110 in which the light-emitting structure 150 is formed by the encapsulating layer 180. The upper substrate 120 may be in direct contact with the encapsulating layer 180. The light-emitting structure 150 may be surrounded by the encapsulating layer 180.

A size of the encapsulating layer 180 may be smaller than the size of the upper substrate 120. For example, the side surface of the upper substrate 120 may be disposed between the side surface of the lower substrate 110 and a side surface of the encapsulating layer 180. The side inclined surface 121sc and the corner inclined surface 120cc of the upper substrate 120 may overlap with the lower substrate 110 in the outside of the encapsulating layer 180. For example, the horizontal distance d2 of the corner inclined surface 120cc may be smaller than a horizontal distance of the lower surface of the upper substrate 120 exposed by the encapsulating layer 180.

The encapsulating layer 180 may have a multi-layer structure. For example, the encapsulating layer 180 may include a lower encapsulating layer 181 and an upper encapsulating layer 182.

The lower encapsulating layer 181 may be in direct contact with the upper passivation layer 170. The lower encapsulating layer 181 may include a curable material. For example, the lower encapsulating layer 181 may include a thermosetting resin.

The upper encapsulating layer 182 may be disposed between the lower encapsulating layer 181 and the upper substrate 120. The upper encapsulating layer 182 may include a curable material. For example, the upper encapsulating layer 182 may include a thermosetting resin. The upper encapsulating layer 182 may include a material different from the lower encapsulating layer 181.

The encapsulating layer 180 may block the moisture permeating from the outside. For example, the upper encapsulating layer 182 may include a moisture-absorbing material 182p.

The organic light-emitting display device according to an aspect of the present disclosure may include a data driver applying a data signal to the display panel 100. The data driver may include source flexible printed circuit boards (source FPCBs) 210 and source drive ICs 220 connected to the display panel 100 by the corresponding source FPCB 210. For example, each the source FPCB 210 may be connected to the source electrode 135 of the thin film transistor 130 by the pad 105. Each source drive IC 220 may be mounted on the corresponding source FPCB 210. Each source drive IC 220 may generate the data signal by converting the digital video data into gamma voltage. For example, the data driver may further include a source printed circuit board 200 connected to the display panel 100 through the source FPCBs 210.

The organic light-emitting display device according to an aspect present disclosure may include a gate driver applying a gate signal to the display panel 100. The gate driver may include gate flexible printed circuit boards (gat e FPCBs) 310 and gate drive ICs 320 connected to the display panel 100 by the corresponding gate FPCB 310. For example, each gate FPCB 310 may be connected to the gate electrode 133 of the thin film transistor 130 by the pad 105. The gate drive ICs 320 may be mounted on the corresponding gate FPCB 310. The gate drive ICs 320 may include a level shifter and a shift resister, respectively.

The source FPCBs 210 and the gate FPCBs 310 may extend onto the upper surface of the upper substrate 120. For example, the source drive ICs 220 and the gate drive ICs 320 may be disposed on the upper surface of the upper substrate 120. The source printed circuit board 200 may be located on the upper surface of the upper substrate 120.

The source FPCBs 210 and the gate FPCBs 310 may extend along the side inclined surface 121sc of the upper substrate 120. The side inclined surface 121sc of the upper substrate 120 may be partially covered by the source FPCBs 210 and the gate FPCBs 310. For example, the gate FPCBs 310 may include a first FPCB insulating layer 311, a FPCB conductive layer 312 and a second FPCB insulating layer 313, respectively. The FPCB conductive layer 312 may be a line for applying the gate signal to the display panel 100 from the corresponding gate drive IC 320. The source FPCBs 210 may have a structure similar to the gate FPCBs 310.

The first FPCB insulating layer 311 may be disposed close to the upper substrate 120. The side inclined surface 121sc of the upper substrate 120 may be in direct contact with the first FPCB insulating layer 311. A thickness of the first FPCB insulating layer 311 may be larger than a height of the concavo-convex shape of the side inclined surface 121sc. Thus, in the organic light-emitting display device according to an aspect of the present disclosure, it may be possible to prevent the FPCB conductive layers 312 of the FPCBs 210 and the gate FPCBs 310 from being damaged by the concavo-convex shape of the side inclined surface 121sc of the upper substrate 120. Therefore, in the organic light-emitting display device according to an aspect of the present disclosure, it may be possible to prevent the distortion and/or the interruption of the signal due to the upper substrate 120 including the side inclined surface 121sc of the concavo-convex shape.

The first FPCB insulating layer 311 and the second FPCB insulating layer 313 may prevent to the FPCB conductive layer 312 due to the external impact. The second FPCB insulating layer 313 may be disposed on an outer surface of the FPCB conductive layer 312. For example, the second FPCB insulating layer 313 may be thicker than the first FPCB insulating layer 311. The thickness of the first FPCB insulating layer 311 may be a value between a thickness of the FPCB conductive layer 312 and a thickness of the second FPCB insulating layer 313. Thus, in the organic light-emitting display device according to an aspect of the present disclosure, it may be possible to efficiently prevent the FPCB conductive layer 312 from being damaged by the concavo-convex shape of the side inclined surface 121sc of the upper substrate 120 and the external impact.

Figure 4:
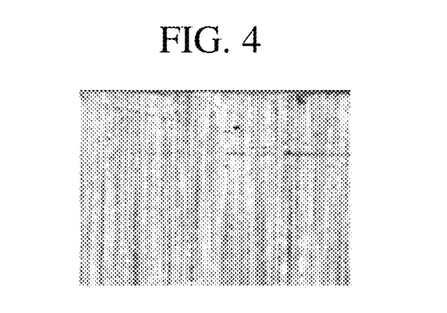
FIG. 4 is a view showing a side inclined surface of an organic light-emitting display device according to another aspect of the present disclosure.

The organic light-emitting display device according to an aspect of the present disclosure is described that the concavo-convex shape of the inclined surface 120cc and 121sc of the upper substrate 120 extends in a direction parallel with the side surface of the upper substrate 120, as shown in FIG. 2D. However, in the organic light-emitting display device according to another aspect of the present disclosure, the concavo-convex shape of the inclined surface 120cc and 121sc of the upper substrate 120 may be not parallel with the side surface of the upper substrate 120. For example, in the organic light-emitting display device according to another aspect of the present disclosure, the inclined surface 120cc and 121sc of the upper substrate 120 may include a concavo-convex shape extending in a direction vertical to the side surface of the upper substrate 120, as shown in FIG. 4.

Figure 5A:
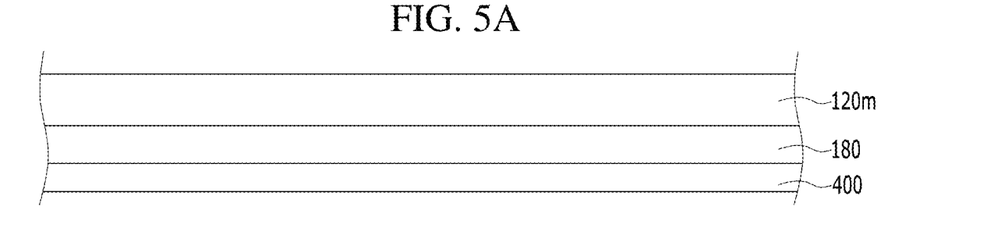
FIGS. 5A to 5D are views sequentially showing a method of fabricating the organic light-emitting display device according to an aspect of the present disclosure.

FIGS. 5A to 5D are views sequentially showing a method of fabricating the organic light-emitting display device according to an aspect of the present disclosure. Referring to FIGS. 1, 2A to 2D, 3 and 5A to 5D, the method of fabricating the organic light-emitting display device according to an aspect of the present disclosure is described. First, the method of fabricating the organic light-emitting display device according to an aspect of the present disclosure may include forming an upper mother substrate 120m using a metal, forming an encapsulating layer 180 on a surface of the upper mother substrate 120m, and forming a linear insulating film 400 on the encapsulating layer 180, as shown in FIG. 5A.

The linear insulating film 400 can prevent the upper mother substrate 120m and the encapsulating layer 180 from being damaged during transfer for next process. For example, the linear insulating film 400 may include an insulating material.

Figure 5B:
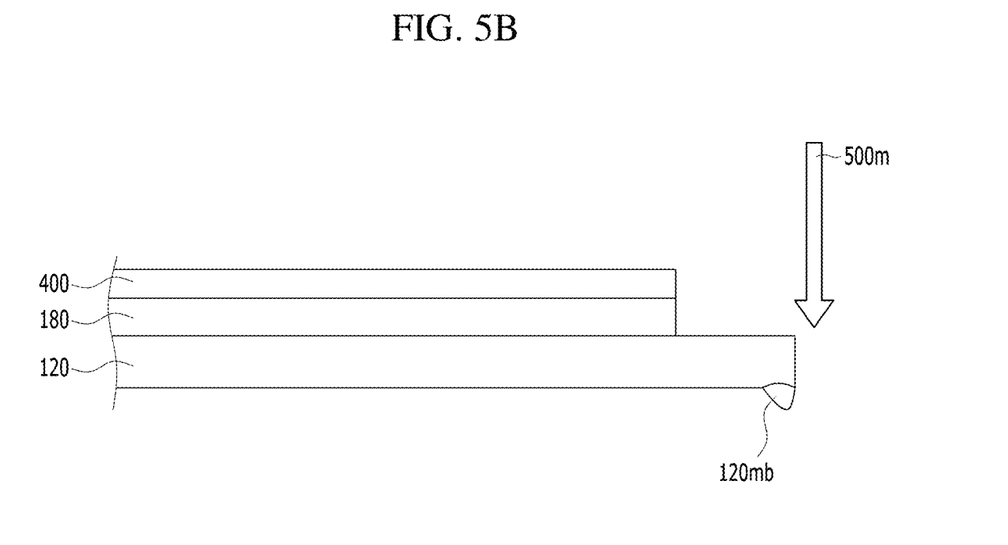

The method of fabricating the organic light-emitting display device according to an aspect of the present disclosure may include forming an upper substrate 120 by cutting the upper mother substrate 120m using a laser 500m, as shown in FIG. 5B.

Forming the upper substrate 120 may include cutting the encapsulating layer 180 and the linear insulating film 400. A laser may be used for the process of cutting the encapsulating layer 180 and the linear insulating film 400. The laser used in the cutting process of the encapsulating layer 180 and the linear insulating film 400 may be different from the laser 500m used in the cutting process of the upper mother substrate 120m. For example, the method of fabricating the organic light-emitting display device according to an aspect of the present disclosure may include a process of sequentially irradiating different types of lasers from the outside of the linear film 400, so that the linear insulating film 400, the encapsulating layer 180 and the upper mother substrate 120m are sequentially cut.

Cutting the upper mother substrate 120m may include melting a metal by the laser 500m. Thus, a metal burr 120mb may be formed at an edge of the surface of the upper substrate 120. For example, the metal burr 120mb may be formed at the edge of the surface of the upper substrate 120 opposite to the encapsulating layer 180.

Figure 5C:
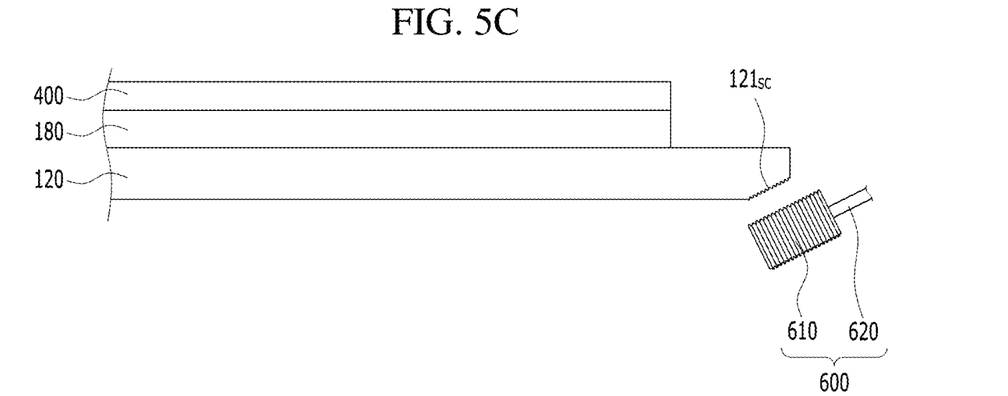

The method of fabricating the organic light-emitting display device according to an aspect of the present disclosure may include removing the metal burr 120mb of the upper substrate 120 using a polishing unit 600, as shown in FIG. 5C.

The polishing unit 600 may include a polishing wheel 610 and a driving axis 620 for rotating the polishing wheel 610. For example, removing the metal burr 120mb may include locating the upper substrate 120 such that the metal burr 120mb faces the polishing wheel 610, rotating the polishing wheel 610 using the driving axis 620, and forming an inclined surface 121sc at the edge of the corresponding surface of the upper substrate 120 using the rotating polishing wheel 610. Thus, in the method of fabricating the organic light-emitting display device according to an aspect of the present disclosure, the metal burr 120mb located at the corresponding portion may be completely removed by single process using the rotating polishing wheel 610. Therefore, in the method of fabricating the organic light-emitting display device according to an aspect of the present disclosure, lowering the process efficiency and uniformity may be prevented.

Forming the inclined surface 121sc may include locating the upper substrate 120 above the polishing wheel 610. For example, forming the inclined surface 121sc may include disposing the upper substrate 120 such that the surface of the upper substrate 120 opposite to the encapsulating layer 180 faces a bottom of a space for the polishing process. Thus, in the method of fabricating the organic light-emitting display device according to an aspect of the present disclosure, scattered particles generated in a polishing process using the polishing wheel 610 may be naturally removed. Therefore, in the method of fabricating the organic light-emitting display device according to an aspect of the present disclosure, the damage and the adhesive failure due to the scattered particles generated in the polishing process may be prevented.

Forming the inclined surface 121sc may include polishing the edge of the upper substrate 120 using a side surface of the polishing wheel 610. Thus, in the method of fabricating the organic light-emitting display device according to an aspect of the present disclosure, it may be possible to prevent the scattered particles generated in the polishing process from flow into the driving unit of the polishing unit 600. That is, the method of fabricating the organic light-emitting display device according to an aspect of the present disclosure may prevent damage to the polishing unit 600 due to the scattered particles and freely adjust the inclination angle of the inclined surface 121sc. Therefore, in the method of fabricating the organic light-emitting display device according to an aspect of the present disclosure, the removing process of the metal burr 120mb using the polishing wheel 610 may be efficiently performed.

The polishing wheel 610 may be a shape for easily polishing the corresponding region of the upper substrate 120. For example, the side surface of the polishing wheel 610 may include a concavo-convex shape having a concave region and a convex region repeated in a direction vertical to the side surface of the polishing wheel 610. The concavo-convex shape of the polishing wheel 610 may extend along the side surface of the polishing wheel 610. Thus, in the method of fabricating the organic light-emitting display device according to an aspect of the present disclosure, the inclined surface 121sc of the upper substrate 120 by the polishing wheel 610 may be formed in the concavo-convex shape.

The method of fabricating the organic light-emitting display device according to an aspect of the present is described that the concavo-convex shape of the inclined surface 121sc of the upper substrate 120 may be equal to the shape of the region of the polishing wheel 610 used in the polishing process. However, in the method of fabricating the organic light-emitting display device according to another aspect of the present disclosure, the inclined surface 121sc of the upper substrate 120 may have a concavo-convex shape different from the region of the polishing wheel 610 used in the polishing process. For example, the method of fabricating the organic light-emitting display device according to another aspect of the present disclosure may include moving the polishing wheel 610 in a direction of extending the driving axis 620 during the polishing process. Thus, in the method of fabricating the organic light-emitting display device according to an aspect of the present disclosure, the lifetime of the polishing wheel 610 may be increased.

The polishing wheel 610 may have a relatively low wear rate as compared to the upper substrate 120. The rigidity of the polishing wheel 610 may be higher than the rigidity of the upper substrate 120. For example, the polishing wheel 610 may be formed of diamond. Thus, in the method of fabricating the organic light-emitting display device according to an aspect of the present disclosure, the inclined surface 121sc of the upper substrate 120 may be uniformly formed by the polishing wheel 610. Therefore, in the method of fabricating the organic light-emitting display device according to an aspect of the present disclosure, the process efficiency and the uniformity may be improved.

In the method of fabricating the organic light-emitting display device according to an aspect of the present disclosure, the polishing wheel 610 or the upper substrate 120 may be rotated. Thus, in the method of fabricating the organic light-emitting display device according to an aspect of the present disclosure, the inclined surface 121sc may be continuously formed on four side surfaces of the upper substrate 120. For example, in the method of fabricating the organic light-emitting display device according to an aspect of the present disclosure, a corner inclined surface 120cc formed at a corner of the upper substrate 120 may be longer than a side inclined surface 121sc located between a front surface and a side surface of the upper substrate 120, as shown in FIGS. 2A and 3. Therefore, in the method of fabricating the organic light-emitting display device according to an aspect of the present disclosure, the process time for removing the metal burr 120mb can be reduced.

Figure 5D:
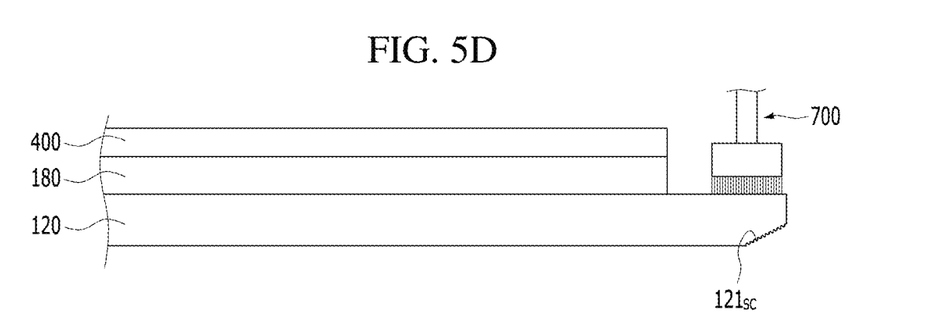

The method of fabricating the organic light-emitting display device according to an aspect of the present disclosure may include cleaning the upper substrate 120 in which the inclined surface 121sc is formed, as shown in FIG. 5D.

Cleaning the upper substrate 120 may include moving particles on the surface of the upper substrate 120 to the outside of the upper substrate 120 using a brush 700. Thus, in the method of fabricating the organic light-emitting display device according to an aspect of the present disclosure, coupling failure between the lower substrate 110 and the upper substrate 120 due to the particles can be prevented.

The method of fabricating the organic light-emitting display device according to an aspect of the present disclosure may include coupling the upper substrate 120 in which the inclined surface 121sc to a lower substrate 110 in which a light-emitting structure 150 is formed, and extending flexible printed circuit board 310 connected to a pad 105 of the lower substrate 110 onto an upper surface of the upper substrate 120 opposite to the encapsulating layer 180, as shown in FIGS. 2A to 2D.

Coupling the upper substrate 120 to the lower substrate 110 may include covering the light-emitting structure 150 using the encapsulating layer 180. For example, coupling the upper substrate 120 to the lower substrate 110 may include locating the upper substrate 120 on the lower substrate 110 such that the encapsulating layer 180 faces the light-emitting structure 150. Thus, in the method of fabricating the organic light-emitting display device according to an aspect of the present disclosure, when the upper substrate 120 is coupled to the lower substrate 110, the inclined surface 121sc may be disposed between an upper surface of the upper substrate 120 opposite to the encapsulating layer 180, and the side surface of the upper substrate 120.

Accordingly, in the organic light-emitting display device according to an aspect of the present disclosure and the method of fabricating the same, the inclined surface 120cc and 121sc may be formed at the edge of the upper substrate 120 on which the metal burr 120mb is formed by using the polishing wheel 610 rotated by the driving unit, so that the metal burr 120mb may be completely removed by the single process. Thus, in the organic light-emitting display device according to an aspect of the present disclosure and the method of fabricating the same, the process efficiency and the uniformity may be prevented from being lowered due to the removing process of the metal burr 120mb. Therefore, in the organic light-emitting display device according to an aspect of the present disclosure and the method of fabricating the same, the reliability may be prevented from being decreased by the metal burr without lowering the process efficiency and uniformity.

Also, in the organic light-emitting display device according to an aspect of the present disclosure and the method of fabricating the same, the first FPCB 311 of FPCBs 210 and 310 being in direct contact with the inclined surface 120cc and 121sc of the upper substrate 120 may be thicker than a height of the concavo-convex shape of the inclined surface 120cc and 121sc, so that it may be possible to prevent the FPCB conductive layer 312 of the FPCBs 210 and 310 from being damaged by the concavo-convex shape of the inclined surface 120cc and 121sc. That is, in the organic light-emitting display device according to an aspect of the present disclosure and the method of fabricating the same, it is possible to prevent the FPCB 210 and 310 from being damaged by the removing process of the metal burr 120mb using the rotating polishing wheel 610. Therefore, in the organic light-emitting display device according to an aspect of the present disclosure and the method of fabricating the same, the reliability may be further increased.

As a result, the organic light-emitting display device according to an aspect of the present disclosure and the method of fabricating the same may include an upper substrate having an inclined surface at an edge of a surface of the upper substrate opposite to an encapsulating layer which is polished by the rotating polishing wheel. Thus, in the organic light-emitting display device according to an aspect of the present disclosure and the method of fabricating the same, the metal burr may be completely removed by the single process. Thereby, in the organic light-emitting display device according to an aspect of the present disclosure and the method of fabricating the same, the reliability may be prevented from being decreased by the metal burr without lowering the process efficiency and uniformity.

What is claimed is:

1. A display device comprising:
   a lower substrate including a pad;
   an encapsulating layer on the lower substrate, the encapsulating layer being spaced away from the pad;
   a light-emitting structure between the lower substrate and the encapsulating layer;
   an upper substrate on the encapsulating layer, the pad of the lower substrate being disposed outside the upper substrate; and
   a flexible printed circuit board connected to the pad of the lower substrate, the flexible printed circuit board extending on an upper surface of the upper substrate,
   wherein the upper substrate includes an inclined surface, the inclined surface includes a concavo-convex shape having a concave region and a convex region which are repeated, and is disposed between the upper surface and a side surface of the upper substrate,
   wherein the flexible printed circuit board includes a first FPCB insulating layer being in direct contact with the concavo-convex shape of the inclined surface, a second FPCB insulating layer disposed on the first FPCB insulating layer, and a FPCB conductive layer between the first FPCB insulating layer and the second FPCB insulating layer,
   wherein a thickness of the first FPCB insulating layer is a value between a thickness of the second FPCB insulating layer and a thickness of the FPCB conductive layer, and
   wherein a surface of the first FPCB insulating layer, in contact with the inclined surface, includes a concavo-convex shape.

2. The display device according to claim 1, wherein the inclined surface of the upper substrate is disposed outside the encapsulating layer.

3. The display device according to claim 1, wherein the pad is disposed at a surface of the lower substrate toward the upper substrate including the inclined surface.

4. The display device according to claim 1, wherein the inclined surface includes a first portion and a second portion having a greater horizontal distance than the first portion, and wherein the flexible printed circuit board is disposed on the first portion of the inclined surface.

5. The display device according to claim 4, wherein the second portion being disposed at a corner of the upper surface.

6. The display device according to claim 4, wherein a vertical distance of the second portion is the same as a vertical distance of the first portion.

7. The display device according to claim 4, wherein the concavo-convex shape of the second portion extends in the same direction as the concavo-convex shape of the first portion.

8. The display device according to claim 7, wherein the concavo-convex shape of the first portion and the concavo-convex shape of the second portion extend along the side surface of the upper substrate.

9. The display device according to claim 1, wherein the upper substrate includes an upper surface which is opposite to the lower substrate, and the upper surface comprises a first edge, a second edge parallel to the first edge, a third edge and a fourth edge parallel to the third edge surrounding the upper surface, wherein the first edge is connected to the third edge at a first corner of the upper surface of the upper substrate and the fourth edge at a second corner of the upper surface of the upper substrate, and the second edge is connected to the third edge at a third corner of the upper surface of the upper substrate and the fourth edge at a fourth corner of the upper surface of the upper substrate.

10. The display device according to claim 9, wherein the inclined surface of the upper substrate is located in at least one of the first edge, the second edge, the third edge, and the fourth edge of the upper surface of the upper substrate.

\* \* \* \* \*